(12) United States Patent
Lee et al.

(10) Patent No.: US 10,333,273 B2
(45) Date of Patent: Jun. 25, 2019

(54) PHOSPHOR MODULE

(71) Applicant: LG Electronics Inc., Seoul (KR)

(72) Inventors: Jongmoo Lee, Seoul (KR); Eunyoung Kim, Seoul (KR); Byungwoo Jeoung, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/943,051

(22) Filed: Apr. 2, 2018

(65) Prior Publication Data

US 2018/0287341 A1 Oct. 4, 2018

(30) Foreign Application Priority Data

Apr. 4, 2017 (KR) .................. 10-2017-0043888

(51) Int. Cl.
  *F21K 9/64* (2016.01)
  *H01S 5/06* (2006.01)
  *F21S 41/16* (2018.01)
  *F21V 29/70* (2015.01)

(52) U.S. Cl.
  CPC .............. *H01S 5/0611* (2013.01); *F21K 9/64* (2016.08); *F21S 41/16* (2018.01); *F21V 29/70* (2015.01)

(58) Field of Classification Search
  CPC .......... H01S 5/0611; F21V 29/70; F21K 9/64; F21S 41/16
  See application file for complete search history.

(56) References Cited

U.S. PATENT DOCUMENTS

| 2014/0003074 A1* | 1/2014 | Kishimoto ......... C09K 11/0883 362/510 |
| 2015/0008816 A1* | 1/2015 | Yoon .................... C09K 11/025 313/503 |
| 2015/0085497 A1* | 3/2015 | Kelso ................. C09K 11/7774 362/317 |
| 2015/0210919 A1* | 7/2015 | Won ........................ C09K 11/02 252/301.6 P |
| 2015/0221623 A1* | 8/2015 | Tischler ............... H01L 25/165 257/89 |
| 2016/0225966 A1* | 8/2016 | Maloney ............... H01L 33/502 |
| 2017/0184254 A1* | 6/2017 | Yamashita ............ F21V 29/502 |

FOREIGN PATENT DOCUMENTS

| JP | 2012185980 A | 9/2012 |
| JP | 2016027613 A | 2/2016 |
| JP | 6056381 B2 | 1/2017 |
| KR | 1716132 B1 | 3/2017 |

* cited by examiner

*Primary Examiner* — Donald L Raleigh
(74) *Attorney, Agent, or Firm* — Fish & Richardson P.C.

(57) ABSTRACT

A phosphor module for a laser light source includes a heat dissipation body, and a reflective layer disposed on the heat dissipation body including metal or an alloy. The phosphor module also includes a phosphor layer disposed on the reflective layer. The phosphor layer includes a glass frit and a phosphor and is configured to: absorb a first light emitted from the laser light source and incident on a first surface of the phosphor layer facing away from the reflective layer; and emit, from a second surface of the phosphor layer opposite the first surface and facing towards the reflective layer, a second light having a second wavelength different from a first wavelength of the first light. The phosphor module also includes a light-transmissive transparent heat dissipation layer disposed on the first surface of the phosphor layer that dissipates heat from the phosphor layer.

18 Claims, 8 Drawing Sheets

PHOSPHOR MODULE

CROSS-REFERENCE TO RELATED APPLICATION

Pursuant to 35 U.S.C. § 119(a), this application claims the benefit of an earlier filing date and right of priority to Korean Patent Application No. 10-2017-0043888, filed on Apr. 4, 2017, the contents of which is incorporated by reference herein in its entirety.

TECHNICAL FIELD

The present disclosure relates to a phosphor module including a glass phosphor.

BACKGROUND

A vehicle typically includes one or more lamp devices that facilitate a driver to stably secure a viewing range outside the vehicle and/or that provide information to other vehicles regarding a driving state of the vehicle.

Examples of lamp devices for vehicles include a headlamp installed in a front portion of a vehicle and a rear lamp installed in a rear portion of the vehicle. The headlamp illuminates a forward region while the vehicle is driving at night. The rear lamp typically includes a brake lamp that is activated when a driver manipulates a brake function, and a turn signal lamp that indicates a traveling direction of the vehicle.

SUMMARY

Implementations disclosed herein enable an improved phosphor module for use with laser light sources.

In one aspect, a phosphor module is configured to convert a wavelength of at least a portion of light emitted from a laser light source, the phosphor module including: a heat dissipation body; a reflective layer disposed on the heat dissipation body, the reflective layer including metal or an alloy; a phosphor layer disposed on the reflective layer, the phosphor layer configured to: absorb a first light that is emitted from the laser light source and that is incident on a first surface of the phosphor layer, the first surface facing away from the reflective layer; and emit, from a second surface of the phosphor layer that is opposite the first surface and that faces towards the reflective layer, a second light having a second wavelength that is different from a first wavelength of the absorbed first light; and a transparent heat dissipation layer disposed on the first surface of the phosphor layer, the transparent heat dissipation layer configured to dissipate heat from the phosphor layer and including a light transmissive material, wherein the phosphor layer includes a glass frit and a phosphor.

In some implementations, a porosity of the phosphor layer is in a range of 5 vol. % or less.

In some implementations, a thickness of the phosphor layer is in a range of 5 μm to 50 μm.

In some implementations, the transparent heat dissipation layer includes one of a sapphire single crystal, $Al_2O_3$, $MgAl_2O_4$, or $AlO_N$.

In some implementations, the transparent heat dissipation layer has a thickness in a range of 100 μm to 500 μm.

In some implementations, the phosphor module further includes: an adhesive layer disposed between the phosphor layer and the reflective layer and configured to couple the phosphor layer to the reflective layer.

In some implementations, the phosphor layer includes a compound of a phosphor and a glass frit including at least one of tetraethyl orthosilicate, tetramethyl orthosilicate, tetrapropyl orthosillicate, tetraisopropyl orthosilicate, PbO, ZnO, or $Bi_2O_3$.

In some implementations, the phosphor is at least one of YAG:Ce, LuAG:Ce, $Sr_2SiO_4$:Eu, or a nitride-based yellow phosphor.

In some implementations, a content of the phosphor in the phosphor layer is in a range of 40 wt. % to 95 wt. %.

In some implementations, the transparent heat dissipation layer includes a plurality of holes configured to reduce a scattering of light that passes through the transparent heat dissipation layer.

In some implementations, a diameter of each of the plurality of holes is in a range of 7 μm or less.

In some implementations, a depth of each of the plurality of holes is in a range of 6% to 50% of a thickness of the phosphor layer.

In some implementations, the phosphor module further includes: a heat conduction layer disposed between the transparent heat dissipation layer and the reflective layer, the heat conduction layer configured to transfer heat from the transparent heat dissipation layer to the reflective layer.

In some implementations, the reflective layer is coated on a surface of the heat dissipation body, and the heat dissipation body is formed of non-light-transmissive conductive material.

In some implementations, the reflective layer is configured to reflect the second light that is emitted from the second surface of the phosphor layer so that the reflected second light is transmitted back through the second surface of the phosphor layer and emitted from the first surface of the phosphor layer.

In some implementations, the transparent heat dissipation layer is configured to: transmit therethrough the first light to be incident on the first surface of the phosphor layer; and transmit therethrough the reflected second light that is emitted from the first surface of the phosphor layer after having been reflected from the reflective layer back through the phosphor layer.

In some implementations, the phosphor layer is configured to: for a first portion of the absorbed first light having the first wavelength, convert the first portion of the first light into the second light having the second wavelength; and for a second portion of the absorbed first light having the first wavelength, transmit the second portion of the first light through the phosphor layer without converting into the second light having the second wavelength.

In some implementations, the phosphor layer is formed by applying firing-molding to a compound of a glass frit and a phosphor coated on the transparent heat dissipation layer before being attached to the reflective layer.

In another aspect, a lamp device for a vehicle includes: a laser light source configured to emit light; and a phosphor module including: a heat dissipation body; a reflective layer disposed on the heat dissipation body, the reflective layer including metal or an alloy; a phosphor layer disposed on the reflective layer, the phosphor layer configured to: absorb a first light that is emitted from the laser light source and that is incident on a first surface of the phosphor layer, the first surface facing away from the reflective layer; and emit, from a second surface of the phosphor layer that is opposite the first surface and that faces towards the reflective layer, a second light having a second wavelength that is different from a first wavelength of the absorbed first light; and a transparent heat dissipation layer disposed on the first surface of the phosphor layer, the transparent heat dissipation layer configured to dissipate heat from the phosphor layer and including a light transmissive material, wherein the phosphor layer includes a glass frit and a phosphor.

In another aspect, a method of manufacturing a phosphor module for a laser light source includes: coating, on a transparent heat dissipation layer, a compound of a glass frit and a phosphor; firing the compound to form a phosphor layer on the transparent heat dissipation layer; and attaching, on a reflective layer, the phosphor layer so that the phosphor layer is arranged between the reflective layer and the transparent heat dissipation layer.

Further scope of applicability of the present application will become more apparent from the detailed description given hereinafter. However, it should be understood that the detailed description and specific examples, while indicating preferred implementations of the disclosure, are given by way of illustration only, since various changes and modifications within the spirit and scope of the disclosure will become apparent to those skilled in the art from the detailed description.

DETAILED DESCRIPTION

Implementations disclosed herein enable an improved phosphor module for performing light conversion with laser light sources. A phosphor module according to implementations disclosed herein utilizes a glass phosphor that achieves improved light output with fewer anomalies, while also being more resistant to high-temperature thermal deterioration. Implementations are also disclosed herein that provide an improved method of manufacturing a phosphor module.

Figure 1:
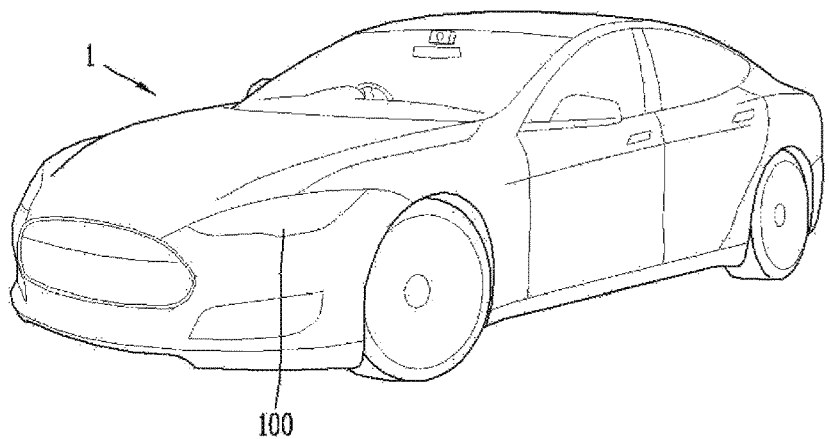
FIG. 1 is a diagram illustrating an example of a vehicle.

Referring to the example of FIG. 1, vehicle 1 includes a lamp device 100, which is typically configured to enable a driver to stably secure a viewing range of a driver and/or to inform other vehicles of a driving state of the vehicle 1, for example in low-intensity illumination environments during driving operations.

Figure 2:
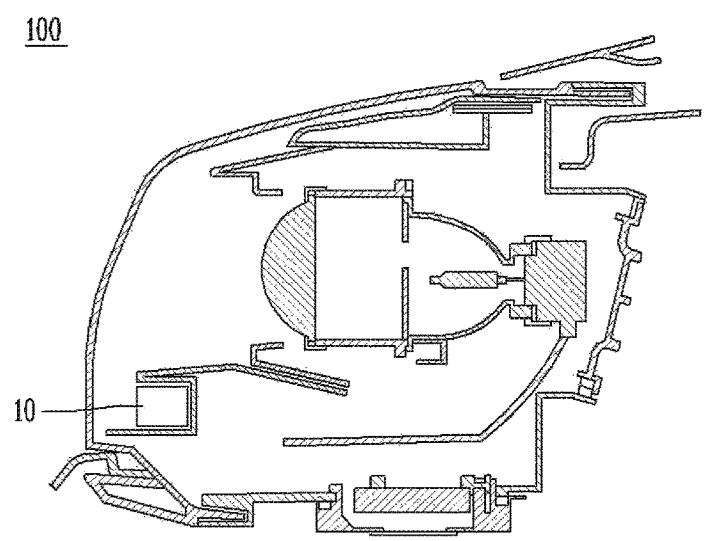
FIG. 2 is a diagram illustrating an example of a cross-sectional view of a lamp device included in a vehicle.

Referring to the example of FIG. 2, the lamp device 100 includes a laser light source 10. The laser light source 10 is typically configured to have good energy efficiency. Particularly, in scenarios in which light emitted from a laser diode has high linearity, the lamp device 100 is able to achieve a long illuminable distance, and can mitigate obstructing a field of view of oncoming vehicles.

A laser diode implemented in the laser light source 10 may be configured to emit white light using various techniques.

As a first example, white light may be realized by mixing different lights emitted from three kinds of laser diodes. In this case, the three kinds of laser diodes typically emit lights of the three primary colors.

As a second example, light that is emitted from a blue laser diode may be converted into yellow light, and as a result, white light may be realized by mixing the yellow light with the light emitted from the blue laser diode. In this case, white light is typically implemented by using one kind of laser.

In the above-described second example, a phosphor is typically utilized to convert the blue light that is emitted from a laser diode. A laser diode typically emits light having a very high output, and therefore if a phosphor is utilized to convert light that is emitted from such a laser diode, a temperature of the phosphor typically increases by 150° C. or more.

In scenarios in which a resin phosphor (hereinafter referred to as a "glass phosphor" or phosphor-in-glass (PIG)) is applied to a conventional light emitting diode (LED) source, thermal quenching occurs in a light conversion operation of a laser light source.

When a phosphor is utilized to convert blue light emitted from a laser diode, the yellow light that is obtained through light conversion by the phosphor is typically scattered and widely spread. Thus, some of the yellow light obtained through light conversion by the phosphor is output to an outside region without being mixed with the blue light. For this reason, a phenomenon hereinafter referred to as a "yellow ring" occurs, where some of the yellow light is diffused to a periphery of an emissive region of the laser light source.

Implementations disclosed herein provide an improved phosphor module that reduces or minimizes a yellow ring occurring in a reflective laser light source. In some implementations, the phosphor module utilizes a glass phosphor that has an easy-to-control scattering factor for light conversion of laser light. As such, implementations according to the present disclosure reduce or minimize a yellow ring occurring in the laser light source.

Also disclosed herein is a method of manufacturing a phosphor module that achieves improved high-temperature performance, and in particular that achieves reduced oxidation for a reflective layer that is applied to the phosphor module.

To achieve the improved phosphor module, implementations according to the present disclosure enables heat occurring in a glass phosphor layer to be dissipated through both surfaces of the glass phosphor layer, thereby preventing a glass phosphor from being deteriorated when light-converting laser light. By dissipating heat in the phosphor layer, the glass phosphor is not deteriorated even when the glass phosphor is utilized in light conversion of laser light.

In comparison with a ceramic phosphor, a glass phosphor has a lower firing temperature, and thus, enables easier control of particle sizes and pores of the phosphor. Accordingly, implementing a glass phosphor to a reflective laser light source reduces a yellow ring effect in a laser light source.

Moreover, to achieve the improved method of manufacturing the phosphor module, the phosphor layer is fired on a transparent heat dissipation layer, and thus the reflective layer is not exposed to high temperatures during the firing process. Accordingly, implementations of the present disclosure prevent the reflective layer from being oxidized in a process of manufacturing a phosphor module.

Before describing a phosphor module according to implementations of the present disclosure, a laser light source that is applied to the phosphor module will be described.

Figure 3:
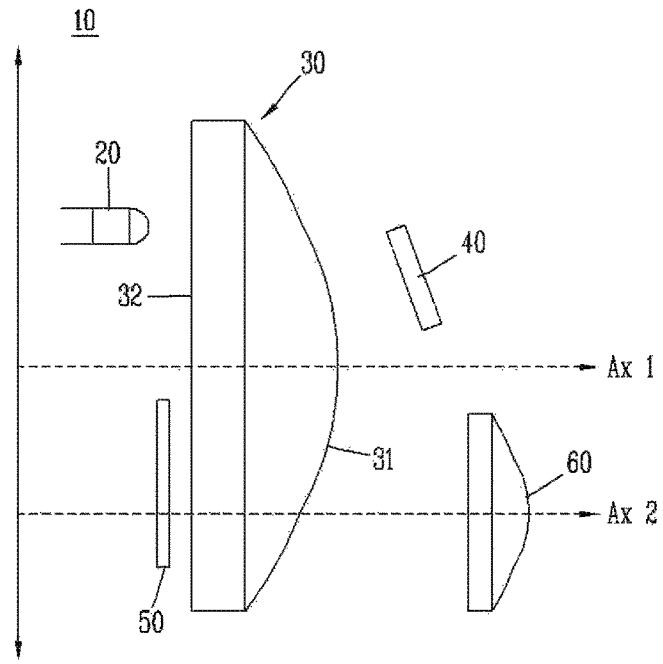
FIG. 3 is a diagram illustrating an example of a reflective laser light source.
Figure 4:
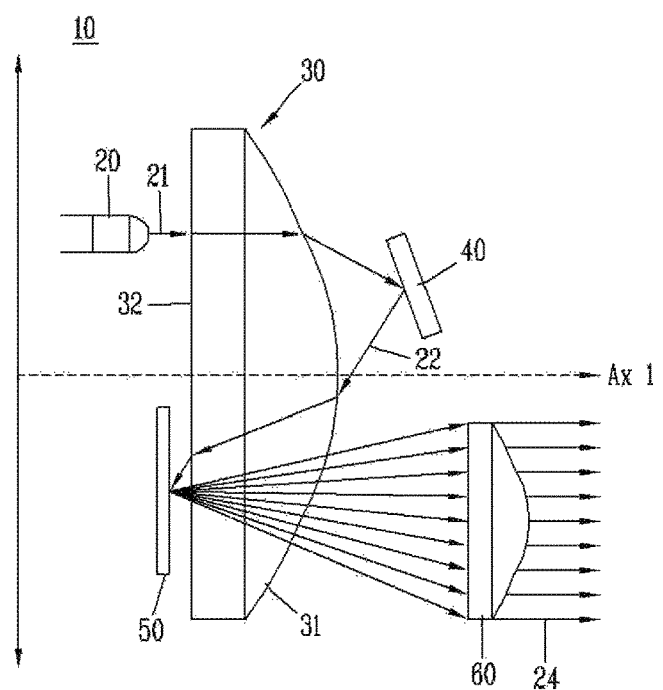
FIG. 4 is a diagram illustrating an example of a traveling path of light in the reflective laser light source illustrated in FIG. 3.

FIG. 3 is a diagram illustrating an example of a reflective laser light source, and FIG. 4 is a diagram illustrating an example of a traveling path of light in the reflective laser light source illustrated in FIG. 3.

A laser light source 10 may be implemented based on a structure of FIG. 3. Referring to FIG. 3, the laser light source 10 may include a blue laser diode 20, a condensing lens 30, a reflective part 40, a phosphor module 50, and a secondary condensing lens 60.

In more detail, referring to FIG. 4, blue light 21 emitted from the blue laser diode 20 may pass through the condensing lens 30 and may be reflected by the reflective part 40. The blue light 22 reflected by the reflective part 40 may again pass through the condensing lens 30 and may be incident on the phosphor module 50.

Some of the blue light incident on the phosphor module 50 may be converted into yellow light. The phosphor module 50 may include a reflective layer, and thus, may reflect some of the blue light incident on the phosphor module 50. Therefore, the yellow light and the blue light reflected by the phosphor module 50 may be combined to generate white light. The white light may be condensed by the secondary condensing lens 60, and then, may be output (24) to the outside.

According to implementations of the present disclosure, the laser light source having the structure described above with reference to FIGS. 3 and 4 may be referred to as a reflective laser light source. As described above, the reflective laser light source may include the phosphor module 50.

The phosphor module 50 may include a phosphor layer for converting blue light into yellow light. In some implementations, the phosphor layer is a glass phosphor. Although ceramic phosphors may be utilized to convert light, rather than resin phosphors and glass phosphors, such ceramic phosphors may contribute to undesirable effects. For example, in a ceramic phosphor, a firing temperature is typically 1,500° C. or greater, which may cause difficulties in controlling a pore and a particle size of the ceramic phosphor, resulting in increased scattering in the phosphor layer and causing a phenomenon referred to as a yellow ring effect, where yellow light is diffused to a periphery of an emissive region of the laser light source. By contrast, a glass phosphor offers relatively easy-to-control particle sizes and pores, which reduces the yellow ring effect.

However, glass phosphors may be susceptible to thermal quenching caused by increased temperatures. In particular, due to a characteristic of a laser diode having a high output of light, in scenarios where a glass phosphor and a resin phosphor are applied to an LED source or the like is applied to the light conversion of the laser diode, thermal quenching may occur in a phosphor. As such, increased temperatures can result in undesirable thermal quenching of the luminescence of the glass phosphor.

Implementations according to the present disclosure are configured to quickly dissipate heat in the glass phosphor when converting laser light, thereby preventing the glass phosphor from being deteriorated while light is being converted. Hereinafter, the phosphor module including the glass phosphor will be described.

Figure 5:
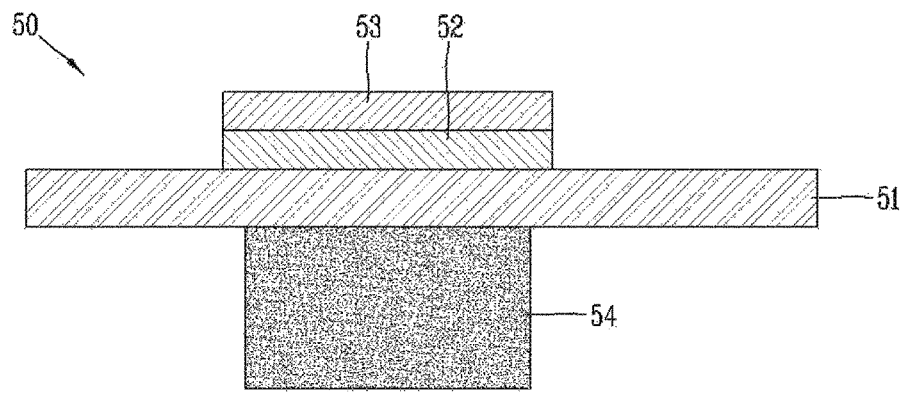
FIGS. 5 and 6 are diagrams illustrating examples of cross-sectional views of a phosphor module according to the present disclosure.
Figure 6:
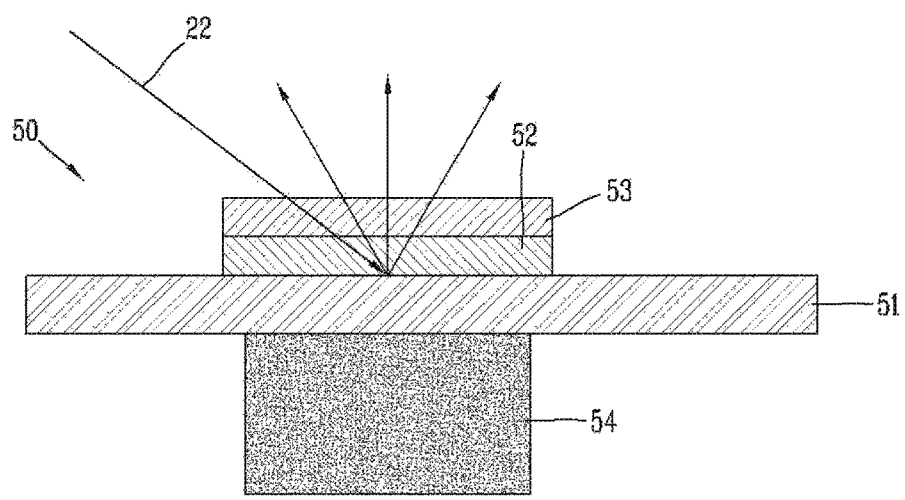

FIGS. 5 and 6 are cross-sectional views of an example of a phosphor module according to the present disclosure.

The phosphor module 50 according to the present disclosure may include a reflective layer 51, a phosphor layer 52, a transparent heat dissipation layer 53, and a heat dissipation body 54. Hereinafter, the above-described elements will be described in detail.

The reflective layer 51 may reflect light incident on the phosphor module and may reflect light, which is light-converted in the phosphor layer 52 and travels toward the reflective layer 51. To this end, the reflective layer 51 may be formed of metal or other material which is high in reflectivity. For example, the reflective layer 51 may be formed of one of aluminum and silver. However, implementations are not limited thereto, and any suitable material of high reflectivity may be utilized.

The reflective layer 51 may have a high heat conductivity. When the reflective layer 51 has a high heat conductivity, the reflective layer 51 may quickly dissipate heat occurring in the phosphor layer 52.

In some implementations, the reflective layer 51 may be a type which is coated on a surface of the below-described heat dissipation body 54. For example, the reflective layer 51 may be formed by coating a metal layer on the heat dissipation body 54 with an evaporator. In this case, a thickness of the reflective layer 51 may be 0.5 μm to 1 μm. In such implementations, an adhesive material by which the reflective layer 51 is adhered to the heat dissipation body 54 may be disposed between the reflective layer 51 and the heat dissipation body 54.

The phosphor layer 52 may be disposed on the reflective layer 51. The phosphor layer 52 may absorb light emitted from a laser diode, and emit light having a wavelength different from that of the absorbed light.

For example, the phosphor layer 52 may absorb blue light emitted from the laser diode convert the blue light to emit yellow light. To this end, the phosphor layer 52 may include a yellow phosphor. For example, the phosphor layer 52 may include at least one of YAG:Ce, LuAG:Ce, $Sr_2SiO_4$:Eu, or a nitride-based yellow phosphor.

In some implementations, the phosphor layer 52 may be formed of a compound of a phosphor and a base material. For example, the phosphor may be firing-molded in a certain type and used, and the base material may be a material which is used for securing firing properties for firing a phosphor. The kind of the phosphor layer may be changed based on the kind of the base material. For example, if the base material is a glass frit, the phosphor layer may be a glass phosphor, and if the base material is ceramic, the phosphor may be a ceramic phosphor.

A physical characteristic and an optical characteristic of the phosphor layer may be changed based on the kind of the base material. In particular, two physical characteristics of the phosphor layer are relevant for light conversion performance: heat dissipation performance, and light scattering performance.

One type of physical characteristic that depends on the type of the base material is a heat dissipation performance of the phosphor layer. In comparison with a ceramic phosphor, the heat dissipation of a glass phosphor is typically less effective. In scenarios where a glass phosphor is used in an operation of converting laser light which is high in output, the glass phosphor may be unable to quickly dissipate heat during the light conversion operation, and thus a phosphor included in the glass phosphor may be deteriorated. For example, when converting the laser light, a temperature of the phosphor layer 52 may increase to 150° C. or more, and in this case, the phosphor can be deteriorated.

Another physical characteristic that depends on the type of the base material is a degree of scattering in the phosphor layer. Scattering in the phosphor layer may be affected by factors including a boundary, a pore, and a bonding between particles formed of base materials. Such scattering factors may scatter light that is obtained through light conversion. When a number of scattering factors are in the phosphor layer, the yellow light obtained through the light conversion is widely spread with respect to the phosphor module, and consequently yellow light may be output to an outside periphery without being combined with the blue light reflected by the reflective layer 51. Therefore, an undesirable yellow ring may be produced near the laser light source.

In a glass phosphor, since a firing temperature is lower than that of a ceramic phosphor, implementations disclosed herein are able to decrease the above-described scattering factors. Thus, implementations according to the present disclosure reduce or minimize the yellow ring effect by utilizing a glass phosphor that facilitates control of a scattering factor. However, glass phosphors are vulnerable to reduced heat dissipation performance, which is exacerbated when the glass phosphor is utilized to convert light in a high-output laser source.

Implementations disclosed herein enable a glass phosphor to achieve improved heat dissipation performance, and thus enable the use of a glass phosphor (with its advantages of reduced-scattering and reduced yellow-ring effects) to perform light conversion for high-output laser sources without suffering deterioration. As such, a phosphor module according to the present disclosure achieves reduced-scattering to mitigate yellow ring effects, while also being more robust against high temperatures of laser light sources.

A base material of the glass phosphor may be a glass frit formed of at least one of tetraethyl orthosilicate, tetramethyl orthosilicate, tetrapropyl orthosilicate, tetraisopropyl orthosilicate, PbO, ZnO, or $Bi_2O_3$. However, the present implementation is not limited thereto.

A content of the phosphor may be 40 wt. % to 95 wt. % with respect to a total mass of the phosphor layer 52. When the content of the phosphor is less than 40 wt. %, a rate of light which is incident on the phosphor module and is converted into the yellow light is less than a certain level, and for this reason, it is difficult to realize white light. When the content of the phosphor is more than 95 wt. %, the content of the base material is excessively reduced, and for this reason, it is difficult to secure firing properties.

A thickness of the phosphor layer 52 may be 5 μm to 50 μm. When the thickness of the phosphor layer 52 is less than 5 μm, a rate of light which is incident on the phosphor module and is converted into the yellow light is less than a certain level, and for this reason, it is difficult to realize the white light. When the thickness of the phosphor layer 52 is more than 50 μm, a dissipation speed of heat occurring in the phosphor layer 52 is reduced, and for this reason, the phosphor is deteriorated.

A mean particle diameter of a particle included in the phosphor layer 52 may be 1 μm to 30 μm, a mean size of pores included in the phosphor layer 52 may be 1 μm or less, and a porosity of the pores included in the phosphor layer 52 may be 5 vol. % or less.

When the phosphor layer 52 satisfying the above-described conditions is applied to a reflective laser light source, an area of the yellow ring may be minimized. A method of measuring the area of the yellow ring will be described below.

A transparent heat dissipation layer 53 may be disposed on the phosphor layer 52. The transparent heat dissipation layer 53 may dissipate heat, occurring in the phosphor layer 52, to the outside.

The transparent heat dissipation layer 53 may be formed of a light transmissive material. Since the transparent heat dissipation layer 53 is disposed on the phosphor layer 52, the transparent heat dissipation layer 53 may be a path through which laser light incident on the phosphor module 50 passes, and may be a path through which light obtained through light conversion passes when being output to the outside. As such, when a light transmittance of the transparent heat dissipation layer 53 is low, a brightness of the laser light source is undesirably reduced by the transparent heat dissipation layer 53.

The transparent heat dissipation layer 53 may also have a high heat conductivity, and this may facilitate heat dissipation from the phosphor layer 52 during a light conversion operation and reduce deterioration of the phosphor layer 52.

Implementations disclosed herein may implement a transparent heat dissipation layer 53 with a high light transmittance and a high heat conductivity. For example, the transparent heat dissipation layer 53 may be formed of one of a sapphire single crystal, $Al_2O_3$, $MgAl_2O_4$, or $AlO_N$.

A thickness of the transparent heat dissipation layer 53 may be 10 nm to 500 μm. When the thickness of the transparent heat dissipation layer 53 is less than 10 nm, a heat dissipation function of the transparent heat dissipation layer 53 is difficult to perform. When the thickness of the transparent heat dissipation layer 53 is more than 500 nm, a light absorption rate in the transparent heat dissipation layer 53 becomes high, and for this reason, a brightness of the laser light source is reduced. Here, the thickness of the transparent heat dissipation layer 53 may be 100 nm or more. This may enable using the transparent heat dissipation layer 53 as a substrate for firing-molding the phosphor layer 52. This will be described below.

In order to enhance a heat dissipation performance of the phosphor module 50, the heat dissipation body 54 may be disposed under the reflective layer 51. The heat dissipation body 54 may be formed of a non-light-transmissive material.

In some implementations, the heat dissipation body 54 may be formed of metal or an alloy which is high in heat conductivity. For example, the heat dissipation body 54 may be an Al alloy (ADC12, AC4C).

Figure 7:
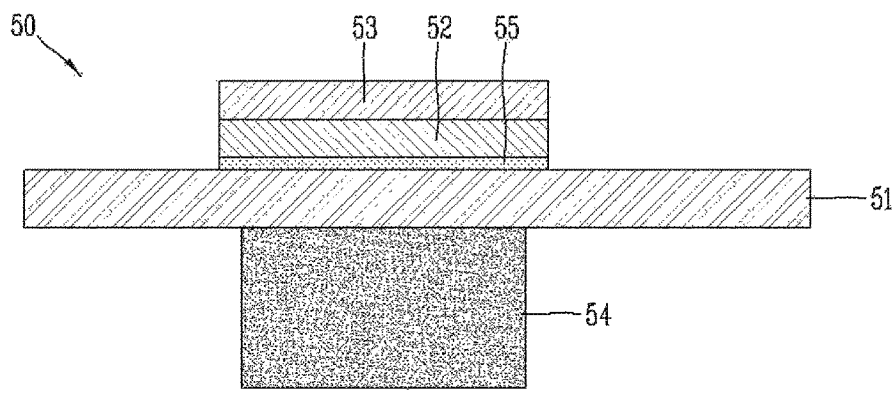
FIG. 7 is a diagram illustrating an example of a cross-sectional view of a phosphor module including an adhesive layer.

Referring to the example of FIG. 7, the phosphor module 50 according to the present disclosure may further include an adhesive layer 55. In some implementations, the adhesive layer 55 may be disposed between the reflective layer 51 and the phosphor layer 52 and may couple the reflective layer 51 to the phosphor layer 52.

The adhesive layer 55 may be formed of a material which is high in reflectivity. For example, the adhesive layer 55 may be formed of a bonding material including at least one of $Al_2O_3$, $SiO_2$, $ZrO_2$, or ZnO which have a reflectivity of 90% or more in a visible light range, or may be formed of a metal bonding material including silver of 90 wt. % or more. In this case, the adhesive layer 55 may act as a reflective layer.

In other implementations, the adhesive layer 55 may be formed of a material which is high in light transmittance. For example, the adhesive layer 55 may be formed of at least one of poly-methyl methacrylate (PMMA), poly-urethane (PU), poly-carbonate (PC), or a siloxane-based bonding material.

Figure 8:
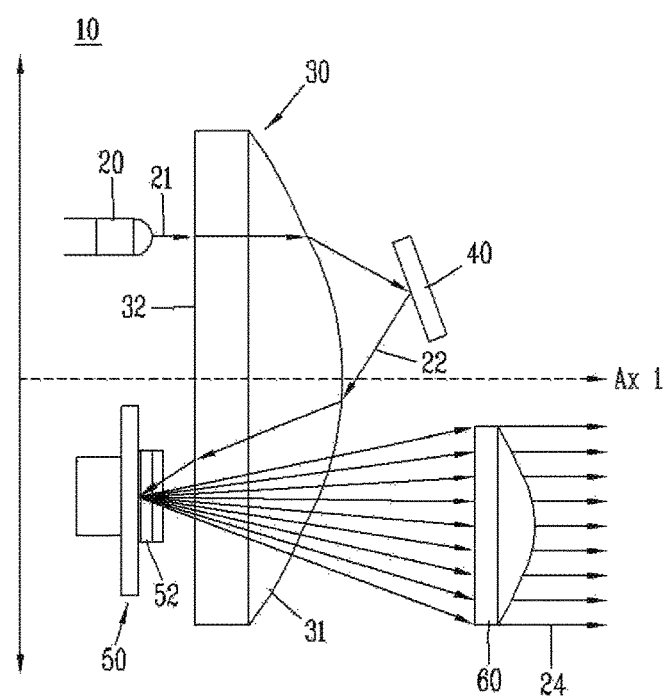
FIG. 8 is a diagram illustrating an example of a laser light source including a phosphor module according to the present disclosure.

Referring to the example of FIG. 8, the phosphor module 50 according to the present disclosure may be applied to the reflective laser light source 10. In some implementations, both surfaces of the phosphor layer 52 included in the phosphor module 50 may be covered by the reflective layer 51 and the transparent heat dissipation layer 53. Heat occurring in the phosphor layer 52 may be dissipated to the reflective layer 51 and the transparent heat dissipation layer 53. Therefore, in some implementations, when light conversion is performed in the phosphor layer 52, a temperature is lowered to 150° C. or less, and thermal quenching is prevented from occurring in the phosphor.

Accordingly, implementations disclosed herein provide improved thermal regulation in the phosphor module and enable the use of a glass phosphor with its easy-to-control scattering factor, which minimizes the yellow ring effect from a laser light source.

Hereinafter, the thermal quenching prevention effect and yellow ring reduction effect of the phosphor module 50 according to the present disclosure will be described.

First, the thermal quenching prevention effect will be described by using a conversion efficiency of the phosphor layer and a luminous flux of light emitted from the phosphor when blue light emitted from a blue laser diode is irradiated onto the phosphor layer.

In detail, when a blue radiant flux of the blue light irradiated from the phosphor layer increases, a luminous flux of the light emitted from the phosphor layer increases, and the conversion efficiency decreases. When thermal quenching does not occur in the phosphor layer, each of the luminous flux and conversion efficiency of the light emitted from the phosphor layer has a linear relationship with the blue radiant flux of the blue light irradiated from the phosphor layer.

However, when the blue radiant flux of the blue light increases, a temperature of the phosphor layer increases, and thus, a possibility that thermal quenching occurs in the phosphor layer increases. When thermal quenching occurs in the phosphor layer, each of the luminous flux and conversion efficiency of the light emitted from the phosphor layer does not have a linear relationship with the blue radiant flux of the blue light irradiated from the phosphor layer.

Figure 9:
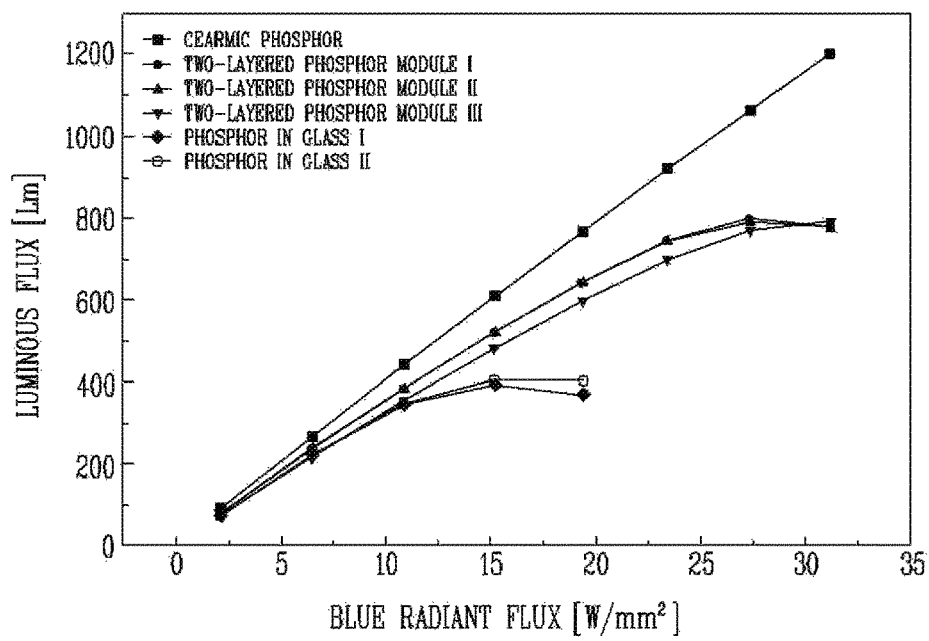
FIG. 9 is a graph showing an example of a luminous flux of light emitted from a phosphor layer with respect to a blue radiant flux of blue light irradiated from the phosphor layer.
Figure 10:
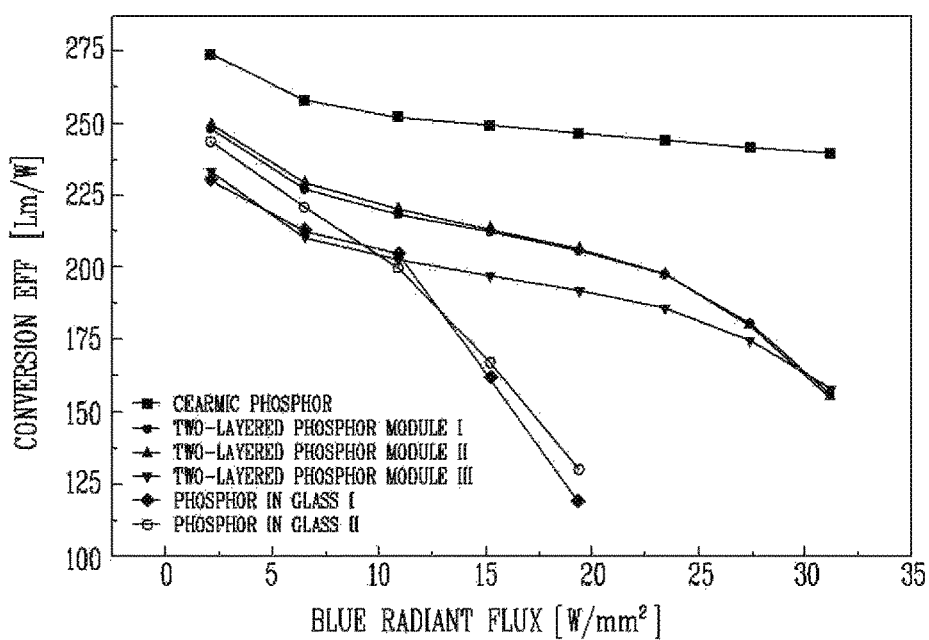
FIG. 10 is a graph showing an example of a conversion efficiency of a phosphor with respect to a blue radiant flux of blue light irradiated from the phosphor layer.

FIG. 9 is a graph showing an example of a luminous flux of light emitted from a phosphor layer with respect to a blue radiant flux of blue light irradiated from the phosphor layer, and FIG. 10 is a graph showing an example of a conversion efficiency of a phosphor with respect to a blue radiant flux of blue light irradiated from the phosphor layer.

Blue laser light is irradiated onto a phosphor layer formed of a ceramic phosphor, a phosphor module (e.g., modules 1 to 3) according to the present disclosure, and a phosphor layer formed of a glass phosphor, and a blue radiant flux of irradiated blue light increases. In this condition, a luminous flux of light emitted from the phosphor layer has been measured. An example of a measurement result is shown in FIG. 9.

Referring to FIG. 9, in the phosphor layer formed of the ceramic phosphor, it can be checked that a blue radiant flux of blue light and a luminous flux of light emitted from the phosphor layer have a linear relationship irrespective of the blue radiant flux of the blue light.

In a phosphor layer formed of a glass phosphor, a blue radiant flux of blue light and a luminous flux of light emitted from the phosphor layer do not have a linear relationship from a time when the blue radiant flux of the blue light exceeds 10 $W/mm^2$.

In the phosphor module according to the present disclosure, when the blue radiant flux of the blue light is 25 $W/mm^2$ or less, the blue radiant flux of the blue light and the luminous flux of the light emitted from the phosphor layer have a linear relationship.

Referring to FIG. 10, in the phosphor layer formed of the ceramic phosphor, it can be checked that a conversion efficiency of a phosphor and a blue radiant flux of blue light have a linear relationship irrespective of the blue radiant flux of the blue light.

In the phosphor layer formed of the glass phosphor, the conversion efficiency of the phosphor and the blue radiant flux of the blue light do not have a linear relationship from a time when the blue radiant flux of the blue light exceeds 10 $W/mm^2$.

In the phosphor module according to the present disclosure, when the blue radiant flux of the blue light is 25 $W/mm^2$ or less, the conversion efficiency of the phosphor and the blue radiant flux of the blue light have a linear relationship.

That is, in comparison with a phosphor formed of only the glass phosphor, it can be checked that in the present disclosure, thermal quenching does not occur in two or more times laser output.

Next, the yellow ring reduction effect of a phosphor module according to the present disclosure will be described. In the present specification, the yellow ring denotes yellow light which is emitted from a periphery of a region, on which blue light is irradiated, of a whole area of the phosphor layer. A display analysis equipment (pro metric) has been used for measuring an area of the yellow ring.

In the present specification, the blue light has been irradiated onto the phosphor module, light emitted from the phosphor module has been irradiated onto a screen which is spaced apart from the phosphor module by a distance of 3 m, and the pro metric has measured an area of a portion corresponding to a yellow color in an image displayed on the screen. The area of the yellow ring has been calculated by using the measured area of the portion corresponding to the yellow color in the image and an actual area of the phosphor layer.

By using the above-described method, a result obtained by measuring a yellow ring area in a phosphor layer formed of a ceramic phosphor layer and a yellow ring area in a phosphor layer included in the phosphor module according to the present disclosure is shown in the following Table 1.

TABLE 1

|  | Ceramic Phosphor | Phosphor Module 1 | Phosphor Module 2 | Phosphor Module 3 |
|---|---|---|---|---|
| Phosphor Brightness ($cd/mm^2$) | 2450 | 2956 | 2098 | 2651 |

TABLE 1-continued

|  | Ceramic Phosphor | Phosphor Module 1 | Phosphor Module 2 | Phosphor Module 3 |
|---|---|---|---|---|
| Yellow Ring Area (%) | 39.0 | 6.5 | 6.6 | 10.5 |

Referring to Table 1, it can be checked that the phosphor module according to the present disclosure is less in yellow ring area than the ceramic phosphor.

Hereinabove, the thermal quenching prevention effect and yellow ring reduction effect of the phosphor module 50 according to the present disclosure have been described.

As the heat dissipation performance of the transparent heat dissipation layer 53 increases, an output of a laser diode applied to the phosphor module increases. Hereinafter, a modification implementation where the heat dissipation performance of the transparent heat dissipation layer 53 increases will be described.

Figure 11:
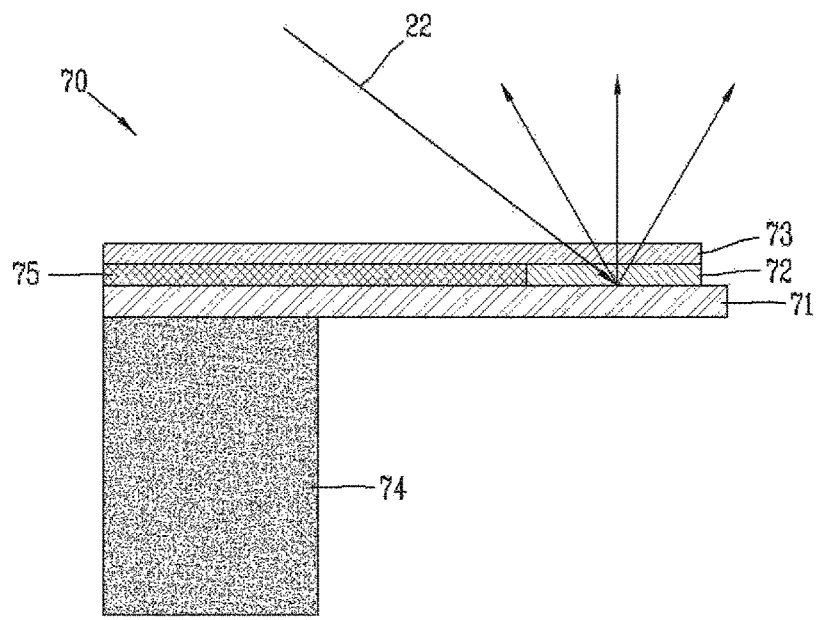
FIG. 11 is a diagram illustrating an example of another implementation of the present disclosure.

FIG. 11 is a diagram illustrating an example of a modification implementation of the present disclosure.

Referring to FIG. 11, a phosphor module 70 according to the modification implementation of the present disclosure may further include a heat conduction layer 75 between a transparent heat dissipation layer 73 and a reflective layer 71, so as to transfer heat of the transparent heat dissipation layer 73 to the reflective layer 71.

The reflective layer 71 may be formed of metal, and moreover, due to a heat dissipation body 74 adjacent to the reflective layer 71, may be better in heat dissipation performance than the transparent heat dissipation layer 73. If heat transferred from a phosphor layer 72 to the transparent heat dissipation layer 73 is fast transferred to the reflective layer 71, a heat dissipation performance of the phosphor module is enhanced. The heat conduction layer 75 quickly transfers the heat, transferred from the phosphor layer 72 to the transparent heat dissipation layer 73, to the reflective layer 71.

In detail, referring to FIG. 11, each of the transparent heat dissipation layer 73 and the reflective layer 71 may further include a region which does not overlap the phosphor layer 72. The heat conduction layer 75 may overlap a region which does not overlap the phosphor layer 72 formed in each of the transparent heat dissipation layer 73 and the reflective layer 71.

Here, blue light 22 emitted from a laser diode may be incident on only a region where the phosphor layer 72 is located, and may not be incident on a region where the heat conduction layer 75 is located. Since the heat conduction layer 75 is not a path through which laser light passes, the heat conduction layer 75 may not be formed of a light transmissive material and may be formed of a material which is high in heat conductivity. For example, the heat conduction layer 75 may be formed of copper (Cu).

As described above, in the present disclosure, heat transferred from the phosphor layer 72 to the transparent heat dissipation layer 73 is quickly transferred to the reflective layer 71, thereby enhancing a heat dissipation efficiency of the phosphor module 70. The phosphor module 70 according to the present disclosure may be applied to a laser diode which is high in output.

Hereinafter, a modification implementation where a plurality of holes is formed in a transparent heat dissipation layer will be described.

In some implementations, a transparent heat dissipation layer included in a phosphor module may include a plurality of holes.

The light emitted from the phosphor layer 52 may pass through the transparent heat dissipation layer 53, and then, may be output to the outside of the laser light source. A plurality of holes formed in the transparent heat dissipation layer 53 may condense light which is scattered in and spread by the phosphor layer 52.

In some implementations, a depth of each of the plurality of holes in the transparent heat dissipation layer 53 may be 6% to 50% of a thickness of the phosphor layer. When the depth of each of the plurality of holes is less than 6% of the thickness of the phosphor layer, a scattering degree reduction effect based on the holes is slight. In a case where the depth of each of the plurality of holes is more than 50% of the thickness of the phosphor layer, when laser light is irradiated onto the phosphor layer 52, a brightness of the phosphor layer 52 is reduced.

In some implementations, a diameter of each of the plurality of holes included in the transparent heat dissipation layer 53 may be 7 μm or less. In a case where the diameter of each of the plurality of holes is more then 7 μm, an area of a yellow ring is reduced, but when laser light is irradiated onto the phosphor layer 52, a brightness of the phosphor layer 52 is reduced.

When the plurality of holes are formed in the transparent heat dissipation layer 53, a contact area between the transparent heat dissipation layer 53 and the outside increases, thereby enhancing a heat dissipation performance of the transparent heat dissipation layer 53.

As described above, in implementations in which a plurality of holes are formed in the transparent heat dissipation layer 53, an area of the yellow ring is reduced, and the heat dissipation performance of the transparent heat dissipation layer 53 is enhanced.

Hereinafter, a method of manufacturing a phosphor module according to the present disclosure will be described.

Figure 12:
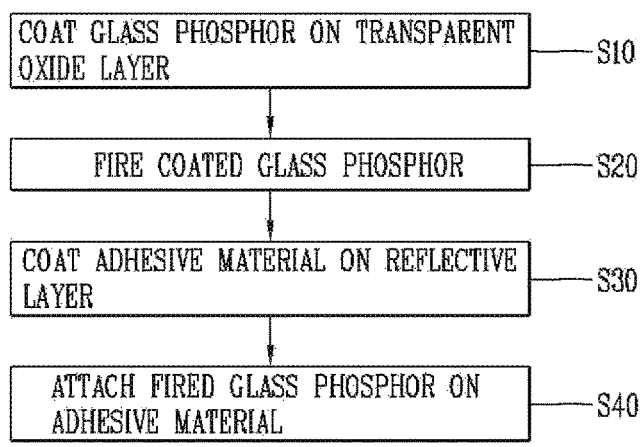
FIG. 12 is a flowchart illustrating an example of manufacturing a phosphor module according to the present disclosure.
Figure 13:
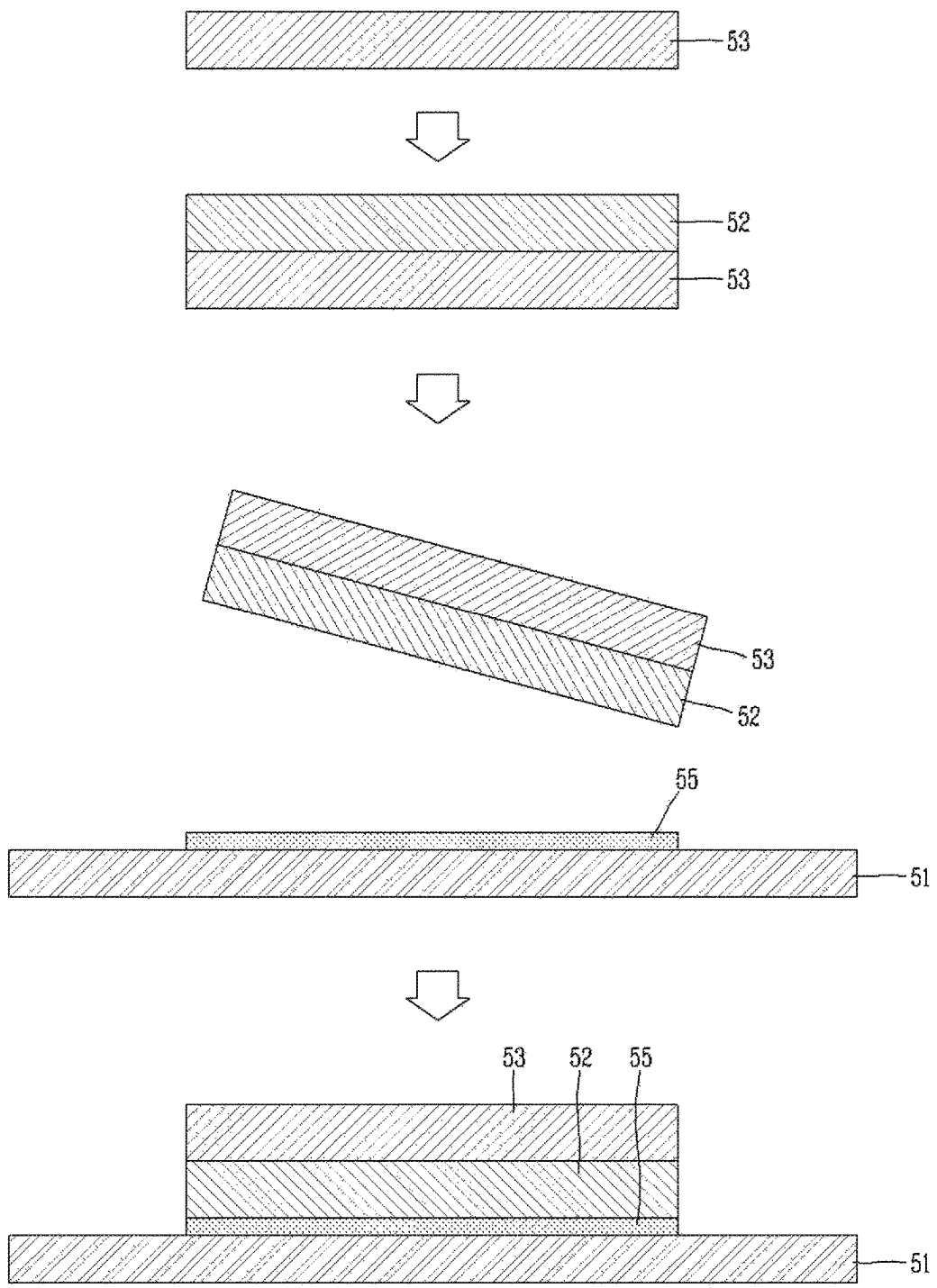
FIG. 13 is a diagram illustrating an example of manufacturing a phosphor module according to the present disclosure.

FIG. 12 is a flowchart illustrating an example of manufacturing a phosphor module according to the present disclosure, and FIG. 13 is a diagram illustrating an example of manufacturing a phosphor module according to the present disclosure.

First, in the manufacturing method according to the present disclosure, an operation (S10) of coating a compound of a glass frit and a phosphor on a transparent heat dissipation layer may be performed. In detail, an inorganic binder including a phosphor and a glass frit may be mixed with ethanol and may be ball-milled for 12 hours to 24 hours, and then, may be coated on the transparent heat dissipation layer. In this case, the transparent heat dissipation layer may act as a substrate which fires a phosphor layer.

Here, the kind of the phosphor and the kind of the glass frit have been described above with reference to FIG. 5, and thus, their detailed descriptions are omitted.

Subsequently, an operation (S20) of firing the compound to form a phosphor layer may be performed. In some implementations, a firing temperature may be 500° C. to 800° C., although implementations are not limited thereto and may include other suitable firing temperatures. As such, elements exposed to the firing temperature may be the phosphor, the glass frit, and the transparent heat dissipation layer. In some implementations, the reflective layer itself is not exposed to high temperatures during this firing operation.

Referring again to the example of FIG. 12, a phosphor layer 52 may be firing-molded on a transparent heat dissipation layer 53. Therefore, in some implementations, the phosphor module does not need a separate adhesive material by which the phosphor layer 52 is adhered to the transparent heat dissipation layer 53.

Subsequently, an operation (S30) of coating the adhesive material on the reflective layer may be performed. However, the present implementation is not limited thereto, and the adhesive material may be coated on one surface of the phosphor layer 52 instead of the reflective layer. The adhesive material may be a material included in the adhesive layer 55 described above with reference to FIG. 7, and thus, its detailed description is omitted.

The reflective layer may be coated and formed on a heat dissipation body. In this case, the phosphor module according to the present disclosure does not need a separate adhesive material by which the reflective layer is adhered to the heat dissipation body.

Finally, referring again to FIG. 12, an operation (S40) of attaching the glass phosphor, fired in the operation (S20), on the adhesive material coated on the reflective layer may be performed. Accordingly, the adhesive material 55 may be disposed between the reflective layer 51 and the phosphor layer 52.

In some implementations, the adhesive material disposed on the reflective layer and the phosphor layer may be a material requiring a curing operation depending on the kind. In this case, an operation of curing the adhesive material at a temperature of 100° C. to 160° C. may be performed. Although the reflective layer may also be exposed to the temperature of 100° C. to 160° C., the reflective layer is protected against being oxidized at those temperatures.

In particular, as described above, in the manufacturing method according to the present disclosure, since the transparent heat dissipation layer 53 is used as a substrate for firing-molding the phosphor layer, the reflective layer formed of metal may not be exposed to a high temperature. Accordingly, in the present disclosure, the reflective layer is prevented from being oxidized in a process of manufacturing the phosphor module.

Hereinabove, the phosphor module including the glass phosphor has been described.

By contrast, a ceramic phosphor poses difficulties in controlling scattering factors in a firing-molding process. In some implementations according to the present disclosure, the plurality of holes may be formed in the phosphor layer formed of the ceramic phosphor, thereby decreasing a degree of scattering in the phosphor layer formed of the ceramic phosphor. Accordingly, even when the ceramic phosphor is applied to a laser light source, an area of the yellow ring is reduced.

Hereinafter, a ceramic phosphor including a plurality of holes will be described.

Figure 14:
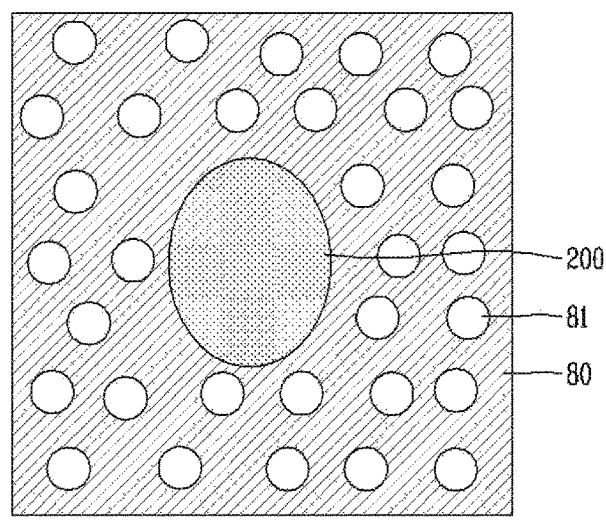
FIG. 14 is a diagram illustrating an example of a hole formed in a ceramic phosphor and an area on which source light is irradiated.
Figure 15:
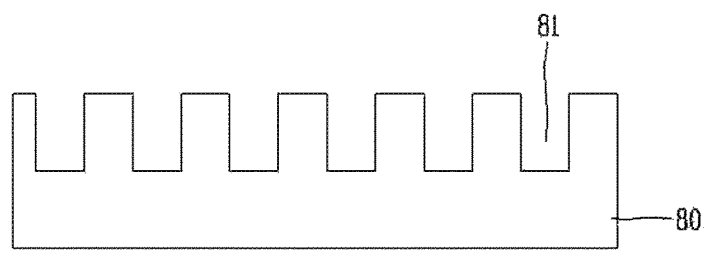
FIGS. 15 and 16 are diagrams illustrating examples of cross-sectional views of a phosphor layer where a plurality of holes are provided.
Figure 16:
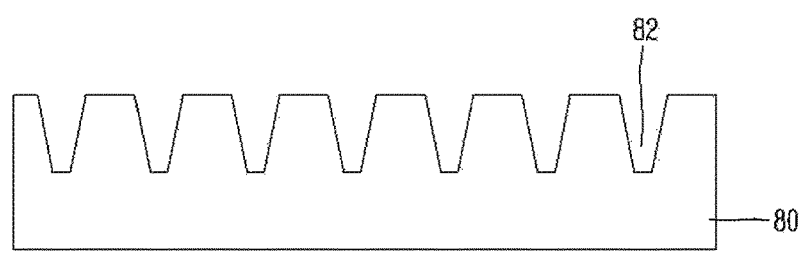

FIG. 14 is a diagram illustrating an example of a hole formed in a ceramic phosphor and an area on which source light is irradiated, and FIGS. 15 and 16 are cross-sectional views of a phosphor layer where a plurality of holes are provided.

A phosphor layer (hereinafter referred to as a ceramic phosphor layer) formed of a ceramic phosphor may include a plurality of holes.

Here, a depth of each of the plurality of holes formed in the ceramic phosphor layer may be 6% to 50% of a thickness of the phosphor layer. When the depth of each of the plurality of holes is less than 6% of the thickness of the phosphor layer, a scattering degree reduction effect based on the holes is slight. In a case where the depth of each of the plurality of holes is more than 50% of the thickness of the phosphor layer, when laser light is irradiated onto the phosphor layer, a brightness of the phosphor layer is reduced.

A ratio of an area occupied by the holes to a whole area of the ceramic phosphor layer may be 20% to 60%. When the ratio is less than 20%, a yellow ring reduction effect is slight, and when the ratio is more than 60%, a brightness of the phosphor layer is reduced.

A diameter of each of the plurality of holes included in the ceramic phosphor layer may be 7 μm or less. In a case where the diameter of each of the plurality of holes is more then 7 μm, an area of the yellow ring is reduced, but when laser light is irradiated onto the phosphor layer, a brightness of the phosphor layer is reduced.

The holes may be formed by a laser processing method. In detail, the holes may be formed by irradiating an ultraviolet (UV) laser onto the ceramic phosphor layer at a pulse width of a pico-second scale. In this case, if a laser having a femto-second scale shorter than the pico-second scale is irradiated, the diameter of each of the holes is reduced.

In some implementations, the ceramic phosphor layer may be formed of a compound of a phosphor, $SiO_2$, and oxide. Here, the ceramic phosphor layer may be formed by firing the compound for 2 hours to 6 hours at a temperature of 1,400° C. to 1,600° C.

Here, the phosphor may be at least one of YAG:Ce, LuAG:Ce, $Sr_2SiO_4$:Eu, or a nitride-based yellow phosphor. However, the present implementation is not limited thereto.

Moreover, $SiO_2$ may be used for a firing process, and a content of $SiO_2$ may be a maximum of 15 mol %. The oxide may be $Al_2O_3$, $MgAl_2O_4$, $AlO_N$, or $SiAlO_N$, and a content of oxide may be a maximum of 60 mol %.

A thickness of the phosphor layer may be 80 μm to 200 μm. When the thickness of the phosphor layer is less than 80 μm, a rate of light which is incident on the phosphor module and is converted into the yellow light is less than a certain level, and for this reason, it is difficult to realize the white light. When the thickness of the phosphor layer 52 is more than 200 μm, the phosphor is non-uniformly formed, and for this reason, scattering factors increase, causing an increase in are of the yellow ring.

Referring to FIG. 14, a region, where a hole is formed, of a ceramic phosphor layer 80 may be a periphery of a region 200, on which blue light emitted from a laser diode is irradiated, of the ceramic phosphor layer 80. In detail, a boundary between the region where the hole is formed and a region where the hole is not formed in the ceramic phosphor layer 80 may be provided near the region 200 on which the blue light is irradiated.

The hole may be provided in plurality. The holes may be formed in various shapes. For example, referring to FIG. 15, a plurality of holes 81 formed in the ceramic phosphor layer 80 may have a cylindrical shape. In some implementations, a lower diameter and an upper diameter of each of the holes may be the same.

On the other hand, referring to FIG. 16, a lower diameter of each of a plurality of holes 82 formed in the ceramic phosphor layer 80 may be less than an upper diameter of each of the holes 82. When the holes are formed through a below-described laser processing process, each of the holes may have a shape described above with reference to FIG. 16.

As described above, in the present disclosure, since a plurality of holes are formed in the ceramic phosphor layer, an area of a yellow ring occurring in a laser light source is reduced.

Hereinafter, when a plurality of holes are formed in a ceramic phosphor layer, a luminous flux variation and luminance variation of a phosphor layer and an area variation of a yellow ring will be described.

In a case where a plurality of holes are formed in a ceramic phosphor layer, an area of a yellow ring can increase, but a luminous flux and luminance of a phosphor layer can decrease. In detail, the luminous flux and luminance of the phosphor layer and the area of the yellow ring can vary based on a diameter and a depth of each of the holes formed in the ceramic phosphor layer.

A result obtained by measuring a luminous flux, luminance, and yellow ring area of the ceramic phosphor layer before and after the holes are processed is shown in the following Table 2.

TABLE 2

| Diameter (μm) | Depth (μm) | Aspect ratio (depth/diameter) | Luminous flux variation | Luminance variation | Yellow ring area variation |
|---|---|---|---|---|---|
| 20 | 20 | 1 | Reduction by 29~31% | Reduction by 32~35% | Reduction by 6~10% |
| 20 | 50 | 2.5 | Reduction by 29~79% | Reduction by 45~72% | Reduction by 2~18% |
| 7 | 6 | 0.86 | Increase by a maximum of 8% | Increase by a maximum of 10% | Reduction by 5~10% |

Referring to Table 2, when a diameter and a depth of each of holes are large, an area of a yellow ring increases, but a luminous flux and luminance of a phosphor layer are reduced. Therefore, the diameter of each of the holes may be 7 μm or less, and the depth of each of the holes may be 6% to 50% of a total thickness of the phosphor layer.

As described above, in the present disclosure, since the plurality of holes are formed in the phosphor layer formed of the ceramic phosphor, an area of the yellow ring occurring in the laser light source is reduced.

The foregoing implementations and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary implementations described herein may be combined in various ways to obtain additional and/or alternative exemplary implementations.

As the present features may be embodied in several forms without departing from the characteristics thereof, it should also be understood that the above-described implementations are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A phosphor module configured to convert a wavelength of at least a portion of light emitted from a laser light source, the phosphor module comprising:
   a heat dissipation body;
   a reflective layer disposed on the heat dissipation body, the reflective layer comprising metal or an alloy;
   a phosphor layer disposed on the reflective layer, the phosphor layer configured to:
      absorb a first light that is emitted from the laser light source and that is incident on a first surface of the phosphor layer, the first surface facing away from the reflective layer; and
      emit, from a second surface of the phosphor layer that is opposite the first surface and that faces towards the reflective layer, a second light having a second wavelength that is different from a first wavelength of the absorbed first light; and
   a transparent heat dissipation layer disposed on the first surface of the phosphor layer, the transparent heat dissipation layer configured to dissipate heat from the phosphor layer and comprising a light transmissive material,
   wherein the phosphor layer comprises a glass fit and a phosphor, and
   wherein the transparent heat dissipation layer comprises a plurality of holes configured to reduce a scattering of light that passes through the transparent heat dissipation layer.

2. The phosphor module of claim 1, wherein a porosity of the phosphor layer is in a range of 5 vol. % or less.

3. The phosphor module of claim 1, wherein a thickness of the phosphor layer is in a range of 5 μm to 50 μm.

4. The phosphor module of claim 1, wherein the transparent heat dissipation layer comprises one of a sapphire single crystal, $Al_2O_3$, $MgAl_2O_4$, or $AlO_N$.

5. The phosphor module of claim 1, wherein the transparent heat dissipation layer has a thickness in a range of 100 μm to 500 μm.

6. The phosphor module of claim 1, further comprising: an adhesive layer disposed between the phosphor layer and the reflective layer and configured to couple the phosphor layer to the reflective layer.

7. The phosphor module of claim 1, wherein the phosphor layer comprises a compound of a phosphor and a glass frit comprising at least one of tetraethyl orthosilicate, tetramethyl orthosilicate, tetrapropyl orthosilicate, tetraisopropyl orthosilicate, PbO, ZnO, or $Bi_2O_3$.

8. The phosphor module of claim 7, wherein the phosphor is at least one of YAG:Ce, LuAG:Ce, $Sr_2SiO_4$:Eu, or a nitride-based yellow phosphor.

9. The phosphor module of claim 8, wherein a content of the phosphor in the phosphor layer is in a range of 40 wt. % to 95 wt. %.

10. The phosphor module of claim 1, wherein a diameter of each of the plurality of holes is in a range of 7 μm or less.

11. The phosphor module of claim 10, wherein a depth of each of the plurality of holes is in a range of 6% to 50% of a thickness of the phosphor layer.

12. The phosphor module of claim 11, further comprising: a heat conduction layer disposed between the transparent heat dissipation layer and the reflective layer, the heat conduction layer configured to transfer heat from the transparent heat dissipation layer to the reflective layer.

13. The phosphor module of claim 1, wherein the reflective layer is coated on a surface of the heat dissipation body, and the heat dissipation body is formed of non-light-transmissive conductive material.

14. The phosphor module of claim 1, wherein the reflective layer is configured to reflect the second light that is emitted from the second surface of the phosphor layer so that the reflected second light is transmitted back through the second surface of the phosphor layer and emitted from the first surface of the phosphor layer.

15. The phosphor module of claim 14, wherein the transparent heat dissipation layer is configured to:

transmit therethrough the first light to be incident on the first surface of the phosphor layer; and transmit therethrough the reflected second light that is emitted from the first surface of the phosphor layer after having been reflected from the reflective layer back through the phosphor layer.

16. The phosphor module of claim 1, wherein the phosphor layer is configured to:

for a first portion of the absorbed first light having the first wavelength, convert the first portion of the first light into the second light having the second wavelength; and for a second portion of the absorbed first light having the first wavelength, transmit the second portion of the first light through the phosphor layer without converting into the second light having the second wavelength.

17. A lamp device for a vehicle, the lamp device comprising:

a laser light source configured to emit light; and a phosphor module comprising:

a heat dissipation body;

a reflective layer disposed on the heat dissipation body, the reflective layer comprising metal or an alloy;

a phosphor layer disposed on the reflective layer, the phosphor layer configured to:

absorb a first light that is emitted from the laser light source and that is incident on a first surface of the phosphor layer, the first surface facing away from the reflective layer; and emit, from a second surface of the phosphor layer that is opposite the first surface and that faces towards the reflective layer, a second light having a second wavelength that is different from a first wavelength of the absorbed first light; and a transparent heat dissipation layer disposed on the first surface of the phosphor layer, the transparent heat dissipation layer configured to dissipate heat from the phosphor layer and comprising a light transmissive material, wherein the phosphor layer comprises a glass frit and a phosphor, and wherein the transparent heat dissipation layer comprises a plurality of holes configured to reduce a scattering of light that passes through the transparent heat dissipation layer.

18. A method of manufacturing a phosphor module for a laser light source, the method comprising:

coating, on a transparent heat dissipation layer, a compound of a glass frit and a phosphor;

firing the compound to form a phosphor layer on the transparent heat dissipation layer; and attaching, on a reflective layer, the phosphor layer so that the phosphor layer is arranged between the reflective layer and the transparent heat dissipation layer, wherein the phosphor layer is formed by applying firing-molding to the compound of the glass frit and the phosphor coated on the transparent heat dissipation layer before being attached to the reflective layer.

* * * * *